(12) United States Patent
Taylor

(10) Patent No.: US 6,286,019 B1
(45) Date of Patent: Sep. 4, 2001

(54) HIGH EFFICIENCY DIGITAL FILTER USING SEQUENTIAL MULTIPLY AND ADD OPERATIONS

(75) Inventor: Jeffrey Eames Taylor, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/408,659

(22) Filed: Sep. 29, 1999

Related U.S. Application Data

(63) Continuation of application No. 08/932,311, filed on Sep. 17, 1997, now Pat. No. 5,982,305.

(51) Int. Cl.[7] ....................................................... G06F 17/10
(52) U.S. Cl. .......................................... 708/303; 708/319
(58) Field of Search .................................. 708/300, 303, 708/319, 490, 452, 525, 603

(56) References Cited

U.S. PATENT DOCUMENTS

| | | |
|---|---|---|
| 5,389,923 | 2/1995 | Iawata et al. . |
| 5,600,320 | 2/1997 | Wilson et al. . |
| 5,712,635 | 1/1998 | Wilson et al. . |
| 5,748,120 | 5/1998 | Yasuda . |
| 5,835,393 * | 11/1998 | Melanson et al. .................... 708/628 |
| 5,880,981 * | 3/1999 | Kojima et al. ......................... 708/523 |
| 5,948,053 * | 9/1999 | Kamiya ................................. 708/522 |

OTHER PUBLICATIONS

Ingle, Vinay K., and Proakis, John G., "Overview of FIR Filter Design", *Digital Signal Processin Laboratory Using the ADSP–2101 Microcomputer*, Prentice Hall, by Analog Devices, Inc., pp. 154–165 (1991).

The Applications Engineering Staff of Analog Devices, DSP Division, "Multirate Filters", *Digital Signa Processing Applications Using the ADSP–2100 Family*, Prentice Hall, vol. 1, pp. 87–132 (1992).

Press, William H., Flannery, Brian P., Teukolsky, Saul A., and Vetterling, William T., "Digital Filtering in th Time Doman", Numerical Recipes in C, *The Art of Scientific Computing*, Cambridge University Press, pp. 558–60 (1994).

* cited by examiner

*Primary Examiner*—Chuong Dinh Ngo
(74) *Attorney, Agent, or Firm*—Workman, Nydegger & Seeley

(57) ABSTRACT

A method for optimizing the design of a digital filter for use in a microprocessor that utilizes sequential multiply and add instructions as distinct from single multiply and accumulate cycles. The method involves alternating the steps of multiplying and adding samples of the input signal and the coefficients that are assigned to the corresponding samples of the input signal. This add and multiply sequence is more efficient on most general-purpose computers than the more common load, multiply, add sequence used for this type of filter operation.

20 Claims, 4 Drawing Sheets

HIGH EFFICIENCY DIGITAL FILTER USING SEQUENTIAL MULTIPLY AND ADD OPERATIONS

CROSS-REFERENCE TO RELATED APPLICATIONS

This application is a continuation of U.S. patent application Ser. No. 08/932,311, entitled "Sample Rate Converter", filed Sep. 17, 1997, now U.S. Pat. No. 5,982,305 which application is incorporated herein by reference in its entirety.

THE FIELD OF THE INVENTION

The present invention relates to digital filtering technology. More particularly, the present invention is directed to a method and system for digitally filtering using sequential multiply and add operations.

THE PRIOR STATE OF THE ART

As the proliferation of computers and computer technologies continues to expand, the use of computers in traditionally non-computer applications grows. This growth is fueled by the increased power and sophistication of computers, computer applications, and computer peripheral devices. One example of an application area in which computer use is increasingly prevalent is applications that involve the storage and manipulation of analog data signals—such as voice, video, handwriting, etc. For instance, with the introduction of sophisticated digital storage media (such as CD-ROM and DAT) and computer players, digital cameras and multimedia capable microprocessor technologies (such as Intel's® MMX Pentium® processors), the use of computers in digital audio and video creation, reproduction and manipulation is becoming increasingly common.

Before a digital computer can store, manipulate or otherwise operate on an analog waveform derived, for instance, from an audio or video signal, the signal must first be transformed into a representative digital form. This transformation is typically referred to as a analog-to-digital conversion, where an analog waveform signal, such as would be present for example with an audio stream, is continuously "sampled" at points along the waveform at predetermined time intervals. Each of these sample points has a corresponding digital data value that corresponds to the magnitude of the analog waveform at that particular point in time. Once in a digital form, the signal can then be manipulated digitally in either computer hardware or software. For instance, the digital signal can be stored on various digital storage media, and then played back or mixed/combined with other digital signals.

The interval at which digital samples are taken when performing the analog-to-digital conversion is typically referred to as the sample rate or the sample frequency. Depending on the particular application, analog signals will be sampled using different sampling rates. Generally, a higher sampling rate corresponds to a higher quality analog to digital conversion. For instance, the sampling frequency used to store high quality digital audio on a standard compact disk (CD-ROM) is 44.1 kHz, whereas the frequency used for storage on a digital audio tape (DAT) is 48.0 kHz.

Often, there is a need to convert a signal sampled at a particular sample frequency into a new signal having the same content, but that has a different sample frequency. For instance, before an audio signal stored on a compact disk (44.1 kHz sampling frequency) can be digitally mixed with an audio signal stored on DAT (48.0 kHz sampling frequency), one of the two signals must first be converted so as to have the same sampling rate as the other, i.e., the sampling rate of one must be increased/decreased to match the rate of the other. Moreover, the conversion must be accomplished so that the quality of the underlying audio signal is preserved, which is difficult because whenever an audio signal's sampling rate is changed, high-frequency noise is introduced. This conversion process is accomplished with what is commonly referred to as a sample rate converter.

Typically, a sample rate converter is presented with an input digital signal having a particular sample rate frequency that needs to be converted to a second sample rate frequency. The input signal is then oversampled (interpolated) by a predetermined interpolation factor so that it has a higher, intermediate sample rate. Since the oversampling/interpolation process typically introduces high frequency noise into the signal, the oversampled signal is then filtered with a low pass filter. The filtered signal is then supplied to a decimator, which removes a number of digital data point samples from the signal based upon a predetermined decimation factor (i.e., the sample rate frequency is decreased). The resulting output signal has the desired sample rate frequency.

Sample rate converters of this sort have been implemented in both hardware and software. However, past approaches typically suffer from a variety of drawbacks—especially when dealing with high quality digital audio or video signals. For instance, if implemented solely with analog electronics, undesirable artifacts are often added into the audio stream, resulting in a decreased signal-to-noise ratio. Further, to maintain a high quality output signal, either a very large filter is required, which is difficult to implement in hardware due to memory and/or processing power constraints, or a staged filter approach is used, where a number of filters are combined in multiple interpolation/decimation stages. This approach is also computationally inefficient and expensive, and does not allow a continuous range of input rates to be converted. This is because each different rate conversion requires a filter having a different cutoff frequency. Thus, there must be a different filter for each different conversion ratio that is to be performed, limiting the usefulness and versatility of the converter, especially where different conversions are needed.

Converters implemented in software have also not been entirely satisfactory. Again, the inability of software converters to provide high quality conversions in a digital audio environment often is due to the tradeoffs that must be made to implement a suitable low pass filter. For instance, some existing software sample rate converters either do not suppress the high-frequency noise introduced as a result of the change to the sampling rate, or they inadvertently filter high frequency components of the signal along with the undesirable high frequency noise components. Either type results in an output signal having a degraded quality. Software approaches that attempt to provide a suitable signal quality are computationally inefficient and expensive, and typically cannot handle a continuous range of input rates. Their computational efficiency is so poor that software based converters typically cannot convert signals in real time, and do not support dynamic sample rates on the inputs and outputs.

The digital low pass filter used in the conversion of sample rates also naturally takes some time. It would be desirable to reduce the amount of time needed to perform the digital filtering operation from the time required using conventional methods. Given the drawbacks with currently available converters, what is needed is a converter that is capable of producing high quality conversions for digital audio, video or similar signal streams. Moreover, the converter should be capable of being implemented in software, and should be computationally efficient so as to be capable of being used in connection with currently available desktops, general purpose computer systems, without requiring specialized and/or dedicated signal processing hardware. Also, the converter should be capable of handling a continuous range of input and output sample rates.

SUMMARY OF THE INVENTION

The foregoing problems in the prior state of the art have been successfully overcome by the present invention, which is implemented in an apparatus and method for a digital sample rate converter. The sample rate converter is capable of changing the sample rate of a digitally-represented signal to a different specified sample rate without adversely affecting the underlying signal quality. For example, the converter can be supplied with a high quality audio digital signal that has a first sample rate frequency, and then convert the signal into an output signal having a different sample rate frequency. The conversion is accomplished so that the output signal still contains the critical audio components of the original input signal, and without introducing noise or other undesirable artifacts into the signal.

The sample rate converter may be comprised of an interpolation function, which increases the sample rate of an input signal (by an integer factor L) to an interpolated, intermediate sample rate. The high frequency signal components introduced in the interpolation function are then removed from the interpolated signal via a low-pass filter function.

This low-pass filter function may be implemented using some or all of the features of the present invention. In one aspect of the invention, the low-pass digital filter uses sequential multiply and add instructions rather than the load, multiply, add sequence used in conventional digital filters. By using the sequential multiply and add instructions, the efficiency of the digital filter is improved by significantly reducing the number of load operations performed by a general-purpose microprocessor.

The filtered signal is then supplied to a decimation function which reduces the sample rate (by an integer factor M) of the filtered signal, resulting in an output signal having the new sample rate.

The sample rate converter may be implemented by way of computer executable instructions, using a program method that is computationally efficient and capable of performing sample rate conversions on high quality digital signals on a general purpose computer, without requiring any specialized hardware. Further, the sample rate converter is capable of operating on a continuous range of input and output sample rates, and can be optimized so as to provide optimal results for a predefined set of critical sampling rates falling within that range. Moreover, the converter utilizes a low pass digital filter that performs the requisite high frequency noise suppression without sacrificing the desired high-frequency signal components, and in a manner so as to provide an output signal having a high signal-to-noise ratio.

In one aspect of the present invention, at least one set of critical sampling rate conversions is identified. This list of critical rate conversions may include, for example, a set of common input rate/output rate conversions that may be encountered in a particular application, such as audio signal processing. For each specific conversion pair identified, there will be zero pitch error introduced in the output signal after the conversion is performed.

The critical rate conversions are used to define the low pass digital filter used in the sample rate converter. Specifically, for the set of discrete input and corresponding output rates, an optimal normalized cutoff frequency for the low pass filter is identified. This filter, which may be a single stage, finite impulse response (FIR) low pass filter, is used to perform the requisite high frequency noise suppression on the signal following the interpolation stage. This single filter is said to be "tuned" for each of the critical input/output sample frequencies, and for those particular conversion ratios provides an output signal without introducing pitch error. Moreover, since the filter is designed so as to have an extremely small passband and transition band, and an extremely large stopband, the filter is also capable of being used for all rate conversions having input/output rates that differ from the critical conversion rates (i.e., non-optimal rates). For these non-optimal conversion rates, the filter provides an output signal having a minimal pitch error introduced by the conversion.

Depending on the signal quality required for a given conversion—which is dictated by such factors as maximum pitch error, maximum signal-to-noise ratio, and minimum suppression of aliasing components—additional filters can be predefined for use in connection with different ranges of conversion rates. Each filter will then be capable of handling a specified continuous range of input and output ratios at a particular level of signal quality. Thus, when executed the sample rate converter will select the best filter for the desired quality.

Once a predefined filter is selected, the interpolation (L) and decimation (M) factors to be used in the conversion are selected to "fit" that particular filter, based on that filter's optimal normalized cutoff frequency. The sample rate of the input signal is then increased (i.e., via the interpolation function) by inserting L-1 zero digital values between each existing discrete digital sample. The resulting signal is then filtered using the predefined low pass filter, which operates only on the non-zero data points by skipping the intervening L-1 zero value data points. The filtered signal is then reduced down (i.e., via the decimation function) to the desired output sample rate by extracting one digital sample for every M samples. The resulting signal then has the desired sample rate.

Because the invention utilizes a predefined filter, there is no need to recalculate, interpolate, or stage the filter at runtime. This increases the computational efficiency of the converter. Further, since the converter utilizes a single stage, very large low-pass FIR filter, good output signal quality is achieved. Moreover, even though it is very large, the filter is designed to skip all zero data points when the interpolated signal is filtered, thereby increasing the computational efficiency to the point where the converter can be implemented on a general purpose computer, without requiring additional dedicated hardware such as signal processors. Further, the converter produces very high quality output signals, and can do so over a continuous range of input and output ratios. For any input/output signal ratio that corresponds exactly with one of the critical rate conversions used to define the predefined filter, no pitch variation is introduced in the output signal. For other non-critical input/output signal ratios, the large size of the filter, ensures that only small variations will occur in the output pitch and that a high quality signal conversion is obtained.

These and other objects, features and advantages of the present invention will be set forth in the description which follows, and in part will be more apparent from the detailed description of a preferred embodiment, and/or from the appended claims, or may be learned by actual practice of the invention.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawing depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention contemplates both methods and apparatus for digitally filtering an input signal. By way of example and not limitation, the invention is described by making reference to figures illustrating the general computing environment in which the invention may be implemented including a sample rate converter, and to functional and flow diagrams that illustrate either the structure or processing flow of embodiments used to implement the method and apparatus. The diagrams should not be construed as limiting of the present invention's scope, but as illustrating an example of a presently understood preferred embodiment of the invention.

Figure 1:
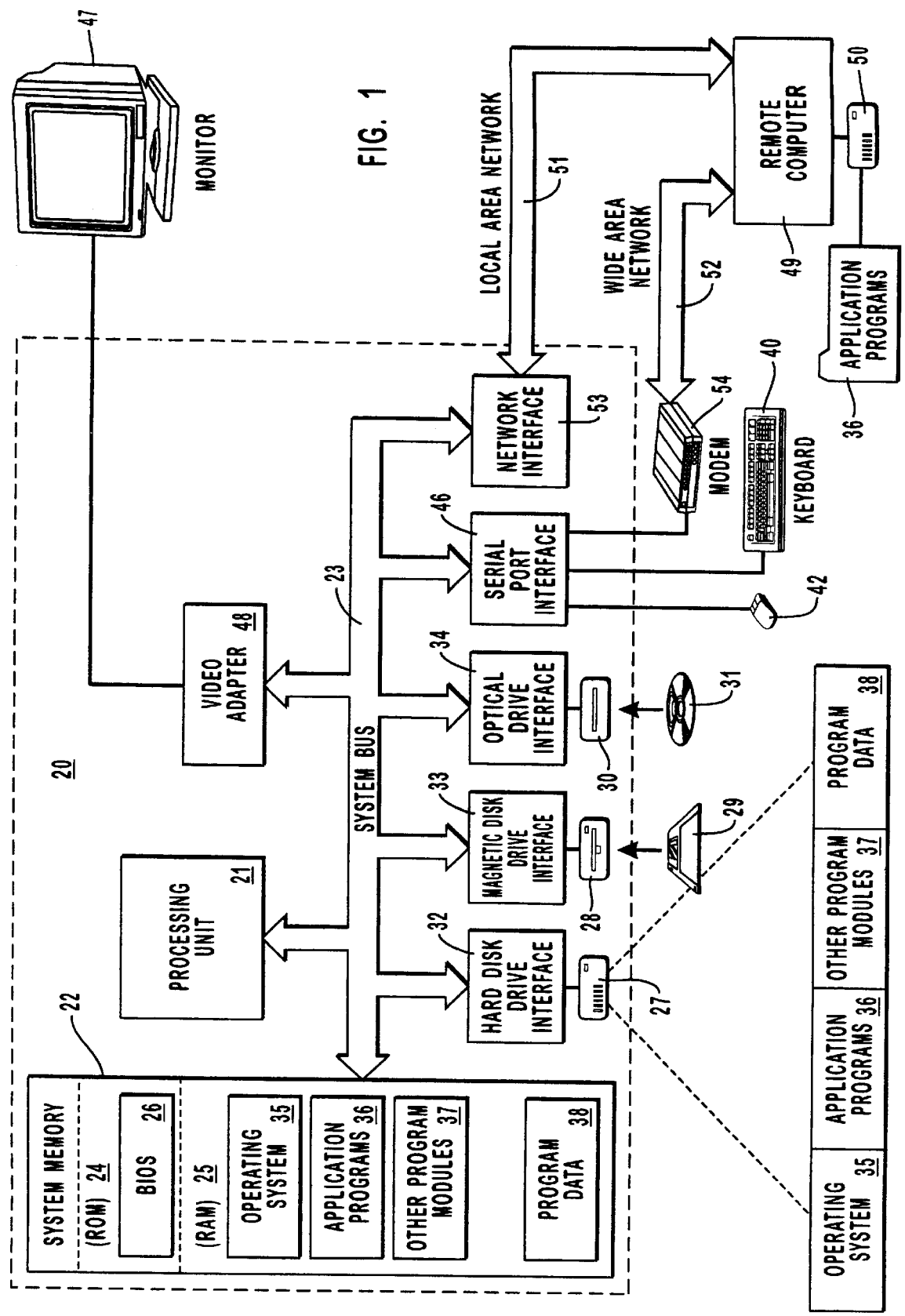
FIG. 1 is a functional block diagram illustrating one example of a suitable computing environment in which the present invention may be implemented.

FIG. 1 and the accompanying discussion are intended to provide a brief, general description of a suitable computing environment in which the invention may be implemented. Although not required, the invention will be described in the general context of computer-executable instructions, such as program modules, being executed by a personal computer. Generally, program modules include routines, programs, objects, components, data structures, etc. that perform particular tasks or implement particular abstract data types. Moreover, those skilled in the art will appreciate that the invention may be practiced with other computer system configurations, including hand-held devices, multi-processor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located in both local and remote memory storage devices.

With reference to FIG. 1, an exemplary system for implementing the invention includes a general purpose computing device in the form of a conventional personal computer 20, including a processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read only memory (ROM) 24 and random access memory (RAM) 25. A basic input/output system 26 (BIOS), containing the basic routines that help to transfer information between elements within the personal computer 20, such as during start-up, may be stored in ROM 24. The personal computer 20 may also include a hard disk drive 27 for reading from and writing to a hard disk, not shown, a magnetic disk drive 28 for reading from or writing to a removable magnetic disk 29, and an optical disk drive 30 for reading from or writing to removable optical disk 31 such as a CD ROM or other optical media. The hard disk drive 27, magnetic disk drive 28, and optical disk drive 30 are connected to the system bus 23 by a hard disk drive interface 32, a magnetic disk drive-interface 33, and an optical drive interface 34, respectively. The drives and their associated computer-readable media provide nonvolatile storage of computer readable instructions, data structures, program modules and other data for the personal computer 20. Although the exemplary environment described herein employs a hard disk, a removable magnetic disk 29 and a removable optical disk 31, it should be appreciated by those skilled in the art that other types of computer readable media which can store data that is accessible by a computer, such as magnetic cassettes, flash memory cards, digital video disks, Bernoulli cartridges, random access memories (RAMs), read only memories (ROM), and the like, may also be used in the exemplary operating environment.

A number of program modules may be stored on the hard disk, magnetic disk 29, optical disk 31, ROM 24 or RAM 25, including an operating system 35, one or more application programs 36, other program modules 37, and program data 38. A user may enter commands and information into the personal computer 20 through input devices such as a keyboard 40 and pointing device 42. Other input devices (not shown) may include a microphone, joy stick, game pad, satellite dish, scanner, or the like. These and other input devices are often connected to the processing unit 21 through a serial port interface 46 that is coupled to the system bus, but may be connected by other interfaces, such as a parallel port; game port or a universal serial bus (USB). A monitor 47 or other type of display device is also connected to the system bus 23 via an interface, such as a video adapter 48. In addition to the monitor, personal computers typically include other peripheral output devices (not shown), such as speakers and printers.

The personal computer 20 may operate in a networked environment using logical connections to one or more remote computers, such as a remote computer 49. The remote computer 49 may be another personal computer, a server, a router, a network PC, a peer device or other common network node, and typically includes many or all of the elements described above relative to the personal computer 20, although only a memory storage device 50 has been illustrated in FIG. 1. The logical connections depicted in FIG. 1 include a local area network (LAN) 51 and a wide area network (WAN) 52 that are presented here by way of example and not limitation. Such networking environments are commonplace in offices enterprise-wide computer networks, intranets and the Internet.

When used in a LAN networking environment, the personal computer 20 is connected to the local network 51 through a network interface or adapter 53. When used in a WAN networking environment, the personal computer 20 typically includes a modem 54 or other means for establishing communications over the wide area network 52, such as the Internet. The modem 54, which may be internal or external, is connected to the system bus 23 via the serial port interface 46. In a networked environment, program modules depicted relative to the personal computer 20, or portions thereof, may be stored in the remote memory storage device. It will be appreciated that the network connections shown are exemplary and other means of establishing a communications link between the computers may be used.

Figure 2:
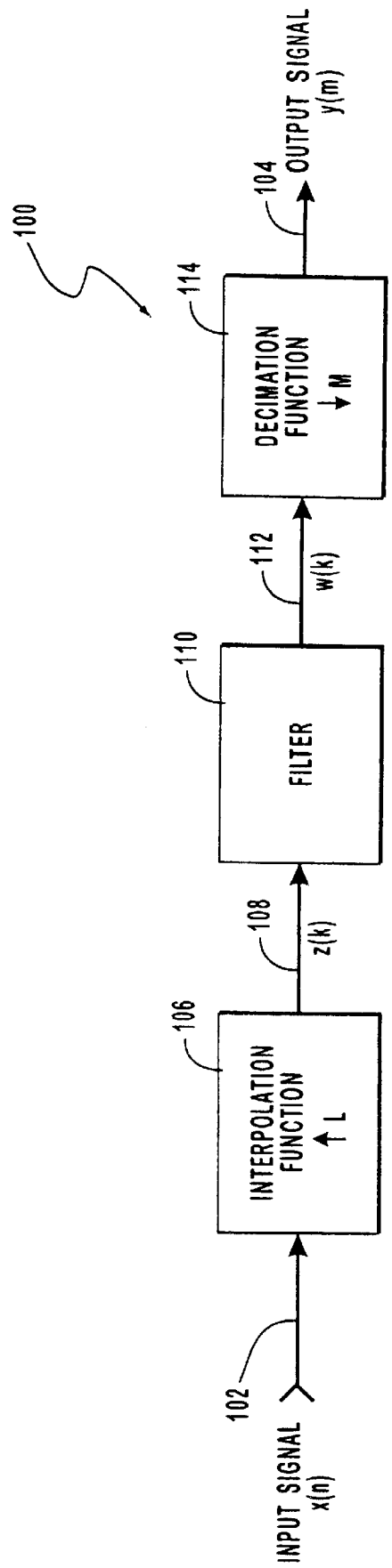
FIG. 2 is a functional block diagram illustrating one embodiment of the present invention.

Reference is next made to FIG. 2 which illustrates an overall functional block diagram illustrating an example of a sample rate converter in which the present invention may be implemented, which is designated generally at 100. As is shown, a discrete-time digital input signal x(n), having a specific first input sample rate frequency ($f_{INPUT}$), is supplied at the input 102 of the converter 100. The converter 100 functions so as to provide at the output 104 a digital output signal y(m), which has the desired second sample rate frequency ($f_{OUTPUT}$).

As is shown generally in FIG. 2, to facilitate this conversion from one sample rate to another, the input signal x(n) is first provided to an interpolation function 106 at input 102, which functions so as to increase the sample rate of the signal x(n) by an integer factor L. The sample rate of the signal x(n) is expanded by inserting L-1 zero-valued samples between the signal's existing data samples, resulting in a signal z(k) having an intermediate sample rate ($f_{INTERMEDIATE}$) at 108. The particular value of L is selected (i.e., "tuned") for the particular filter that is selected for the converter, described below.

The intermediate signal z(k) is then supplied to the input of filter function 110. Filter 110 filters the signal so as to eliminate any high frequency noise or images introduced by the rate expansion. As will be described in further detail below, the filtering function is preferably performed with a predefined, single-stage finite impulse response (FIR) low-pass filter, which has an extremely small passband and transition band, and an extremely large stopband. Further, the single filter is designed so as to be capable of filtering signals having sample rates that fall within a predetermined, continuous range of input and output sample rates and in a manner so that little or no pitch error is introduced on the output signal.

Optionally, the sample rate converter can be configured with a plurality of predefined low-pass filters, each of which is optimized to handle a different continuous range of input and output conversion ratios. At runtime, one of the predefined filters will be selected, depending on the particular conversion to be performed (i.e., the filter designed to cover the range that the specified conversion falls within) and the quality desired for the conversion. For particular "critical" input/output ratios, the filter will introduce no pitch variation on the output. For other non-optimal/non-critical conversion ratios the filter will produce only minor variations in the output pitch, due to the fact that a large FIR filter is used. Also, depending on the particular quality of the conversion that is required, the filter(s) can be predefined so as to have a desired maximum pitch variation. For instance, the number of taps and their coefficients can be varied to achieve any passband, stopband, and transition width for the filter. In FIG. 2, the resulting filtered signal w(k) is shown at 112.

The filtered signal w(k) is then supplied to decimation function 114, which functions so as to reduce the sample rate of the filtered intermediate signal w(k) by an integer factor M. The sample rate of the signal w(k) is compressed by removing M-1 data samples for every M data samples, resulting in an output signal y(m) having the desired sample rate ($f_{OUTPUT}$). Like the interpolation factor L, the actual value of M is selected based on the particular predefined filter that is selected to perform the conversion.

Figure 3:
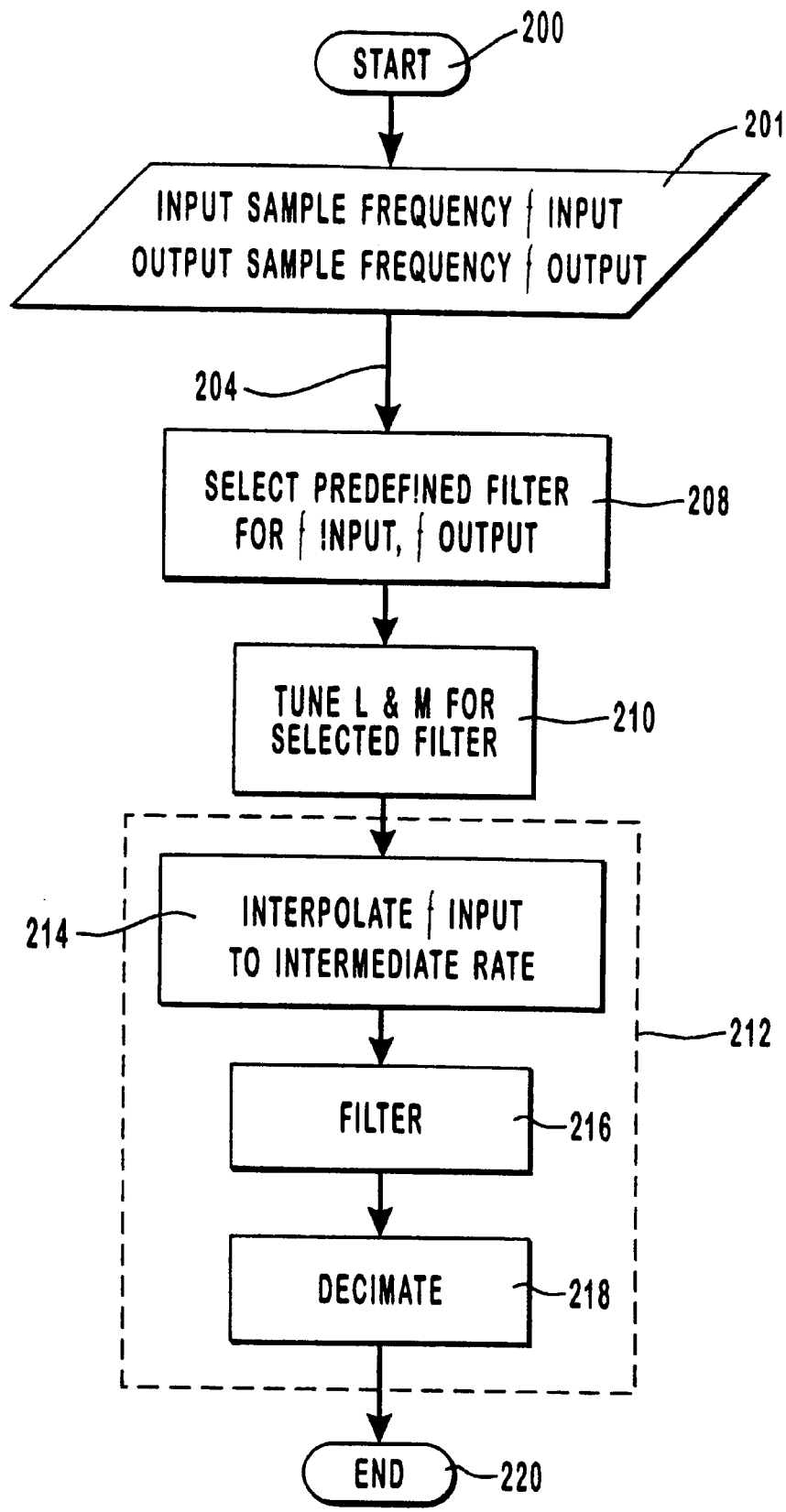
FIG. 3 is a functional flow diagram illustrating one embodiment of the program method of the present invention.

Reference will next be made to FIG. 3, which is a flow chart illustrating in further detail an example of the program flow, implemented by way of computer-executable instructions, that could be used to implement the general functions illustrated in FIG. 2. It will be appreciated that while the following illustrates the sample rate converter 100 as being implemented by way of computer-executable instructions running on a general purpose computer, other embodiments could also be used, including dedicated electronic hardware such as custom integrated circuitry or a combination of specialized electronics and software.

Program step 200 in FIG. 3 represents those series of computer-executable instructions that correspond to the start-up and initialization of the overall program method. It will be appreciated that the sample rate converter could be implemented as an integrated utility or program module contained within, for instance, the kernel of an operating system or within a specialized application. Alternatively, the program method could be embodied as a separate, stand-alone utility used, for instance, in a specialized environment such as the mixing and computer playback of digital audio streams. Thus, the particular start-up and initialization steps will depend upon the particular environment and context in which the program method is used.

Once the initialization process is complete, the processing unit 21 will proceed with the execution of the program steps according to functional block 201. At this step, a digital signal having a particular input sample frequency $f_{INPUT}$ is identified, and a desired output sample frequency $f_{OUTPUT}$ is selected. Again, the manner of providing this input data and the desired output parameters can vary, and will depend on the particular context in which the program method is executed.

Once the appropriate $f_{INPUT}$ and $f_{OUTPUT}$ data and parameters are input, the processing unit 21 will proceed with the execution of the program steps according to functional block 208. In the preferred embodiment, a collection of filters will have already been predefined in a manner so that each single filter can be used for a predetermined quality of output. The predefined filter(s) are stored in computer storage (e.g., hard disk drive storage 27 in FIG. 1). Thus, at the time of execution of the sample rate converter 100, an appropriate filter will be selected from the preexisting bank of configured filters, based on the desired quality of conversion. Because the filters are predefined, and because they are defined so as to each be capable of operating on a continuous range of input anti output rates, filters do not have to be regenerated at run-time, nor do they need to be regenerated every time a new input/output rate conversion is performed. This reduces the computational overhead required by the sample rate converter 100, and greatly increases its efficiency.

It will be appreciated that while a plurality of filters can be predefined, in certain embodiments the converter 100 may be configured with only a single, predefined filter, which will be used for all input/output sample rate conversions. This may occur, for instance, where the converter will only be used in a specific application, such as an audio signal mixer, and it is known that all of the conversions that will be encountered fall within a typical frequency range. In this instance, only a single filter would be required.

Figure 3A:
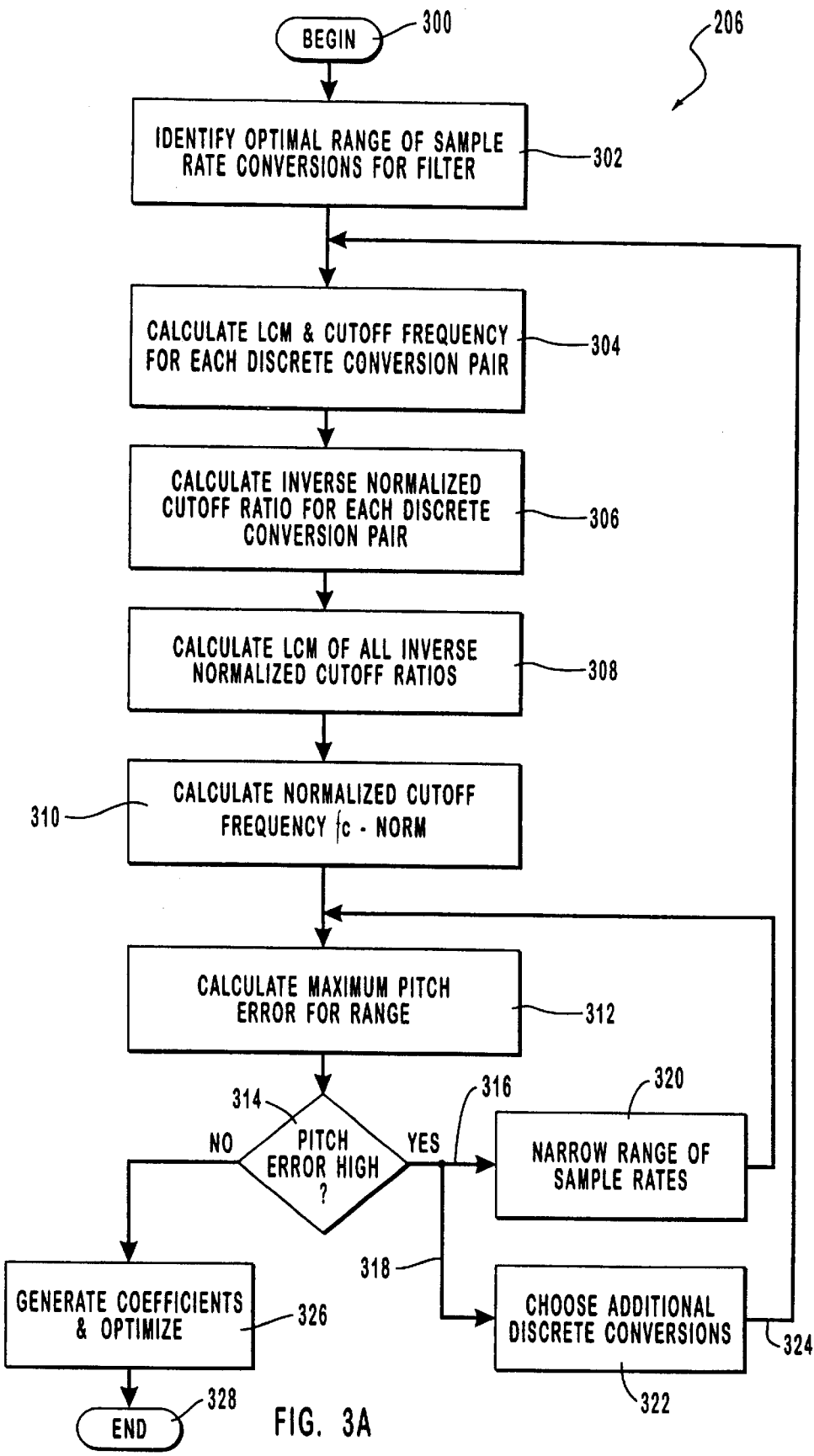
FIG. 3A is a functional flow diagram illustrating one presently preferred embodiment of the series of method steps used to define a filter used by the program illustrated in FIG. 3.

Reference is next made to FIG. 3A, which illustrates the preferred series of steps for defining a filter for subsequent use by the series of program steps in FIG. 3. Although some aspects of the method for defining the filter may be done manually, the more math intensive aspects of the design process are performed with the aid of a computer.

The series of method steps used to define a filter begin at method step 300 in FIG. 3A. At step 302, a critical set of discrete input and corresponding output sample rate conversions for the filter are identified. In a preferred embodiment, the filter will be configured so that it is optimized for each of these critical conversion rates so that there will be a zero pitch error associated with the output signal. It is expected that a particular set of conversions will be selected based upon the particular application, such as high quality audio stream mixing, which will in turn dictate the most common "critical" conversions to be encountered.

For purposes of example, and not limitation, TABLE 1 illustrates a set of optimal rate conversions for which a filter will be defined. The discrete conversions contained within TABLE 1 are a common set of conversions that would likely be encountered in an application involving standard audio signals, such as a digital sound mixer.

TABLE 1

| Input Rate ($f_{INPUT}$ Hz) | Output Rate ($f_{OUTPUT}$ Hz) |
|---|---|
| 44100 | 48000 |
| 11025 | 44100 |
| 22050 | 44100 |
| 48000 | 44100 |
| 11025 | 22050 |
| 44100 | 22050 |
| 22050 | 11025 |
| 44100 | 11025 |

Having defined the optimal set of critical discrete input/output conversions an appropriate filter for use in connection with the selected conversions is identified. First, at method step 304, the lowest common multiple (LCM) and the cutoff frequency for each discrete conversion pair is calculated. The LCM is the lowest number that can be divided by the two rates in the conversion pair with no remainder. The cutoff frequency for the conversion pair may be the minimum of the cutoff frequencies for the input and output sample frequencies. Based on the assumption that each signal was sampled at its Nyquist frequency, the cutoff frequency for the input and the output signal is defined as being one-half of each signal's sample rate frequency:

$f_{CUTOFF}$=Sample Rate/2.

After the LCM and the cutoff frequency for each discrete pair has been calculated, at method step 306 the inverse normalized cutoff ratio for each discrete conversion pair is calculated. This value is calculated by dividing the LCM of the two rates by the cutoff frequency ($f_{CUTOFF}$) of the two rates:

Inverse_Normnalized_Cutoff_Ratio=(LCM of rate pair)/($f_{CUTOFF}$ of rate pair).

Next, in order to insure that a single filter is optimized for each conversion pair within the range, the lowest common multiple for all of the inverse normalized cutoff ratios is calculated. This step is illustrated at functional step 308. At step 310, this LCM value is then used to calculate the normalized cutoff frequency for the range, which is equal to one divided by the LCM value:

Normalized_Cutoff_Freq ($f_{C\text{-}NORM}$)=1/(LCM of Inverse Normalized Cutoff Ratios)

By way of example, TABLE 2 illustrates the LCM, the cutoff frequency, and the Inverse Normalized Cutoff ratio for the range of optimal discrete input and output rates identified in TABLE 1:

TABLE 2

| Input Rate ($f_{INPUT}$Hz) | Output Rate ($f_{OUTPUT}$ Hz) | LCM | Cutoff Frequency ($f_{CUTOFF}$) | Inverse Normalized Cutoff Ratio |
|---|---|---|---|---|
| 44100 | 48000 | 7056000 | 22050 | 320 |
| 11025 | 44100 | 44100 | 5512.5 | 8 |
| 22050 | 44100 | 44100 | 11025 | 4 |
| 48000 | 44100 | 7056000 | 22050 | 320 |
| 11025 | 22050 | 22050 | 5512.5 | 4 |
| 44100 | 22050 | 44100 | 11025 | 4 |
| 22050 | 11025 | 22050 | 5512.5 | 4 |
| 44100 | 11025 | 44100 | 5512.5 | 8 |

From the example critical conversion ratios in TABLE 2, it can be seen that the LCM of the Inverse Normalized Cutoff Ratios is 320. Thus, the Normalized Cutoff Frequency ($f_{C\text{-}NORM}$) for the corresponding low pass filter to be used in connection with this particular set of discrete input and output rates is 1/320=0.003125.

This particular normalized cutoff frequency will provide optimal filtering for any of the set of critical input/output rates specified. Moreover, the filter can also be used in connection with other input/output rates that are not included in the critical list. For those non-critical rates however, there will be some degradation in the quality of the output signal. In the preferred embodiment, a facility for determining the maximum acceptable error on the output signal is provided. Whether the resulting filter is capable of providing the requisite quality of conversion for a particular range of input/output sample frequencies may depend on a variety of factors. For instance, factors such as the particular application involved, the maximum acceptable signal-to-noise ratio (SNR), the minimum suppression of aliasing components, the maximum pitch error, and/or the range of sampling rates, may be taken into consideration when determining whether a particular filter will provide a sufficient conversion quality.

By way of example, functional step 312 illustrates how one factor—pitch error—may be used to determine whether the filter will provide a satisfactory conversion for a given range of potential input/output frequencies. The determination may then be made as to whether that maximum possible error is acceptable, or if the range—and the corresponding filter parameters—should be modified so as to result in better signal quality. Thus, at step 312 the maximum pitch error for a given inverse normalized cutoff ratio (and corresponding Normalized Cutoff Frequency) for a specified sample rate frequency range is determined. This is done by first identifying the minimum and maximum allowable sample rates to be used in connection with this particular filter. For purposes of example, the minimum input rate identified for use in connection with the defined filter is set at 8 kHz, and the maximum rate is set at 48 kHz. To calculate the maximum pitch error that could result for conversions performed on input/output ratios falling within this range (i.e., 8 kHz –48 kHz), the minimum values for L and M are first calculated since the maximum change in sampling rate occurs for the conversion from the minimum to maximum rates (or vice versa). For an 8 kHz to 48 kHz conversion, the cutoff frequency is 4 kHz. To be operable with the filter defined above, the interpolated rate is calculated:

Interpolated Rate=$f_{CUTOFF}/f_{C-NORM}$

Interpolated Rate=4 kHz/0.003125=1,280 kHz.

Thus, the interpolation factor (L) is equal to the interpolated, or intermediate sample frequency rate divided by the input frequency:

L=Interpolated Rate/Input Frequency Rate=1280 kHz/8 kHz=160.

The decimation factor (M) is equal to the interpolated rate divided by the output frequency:

M=Interpolated Rate/Output Frequency Rate=1280 kHz/48 kHz= 26.66.

M is then rounded to the nearest whole integer, so that M=27. Thus, the maximum value for L or M is 160, and the minimum value is 27, The maximum pitch error occurs whenever the "true" factor is halfway between two integers. Therefore, the maximum pitch error (as a percentage) would occur at 0.5 more than the minimum factor, or 27.5 in this example. The maximum pitch error that would ever occur with this filter for this particular sample range is calculated by dividing 0.5 by the minimum factor that would be encountered (27), which results in 1.85%.

Once the maximum pitch error is calculated for the specified range, the processing unit 21 proceeds to functional step 314, where it is determined whether the error is acceptable. If the pitch error is too high for the given application, one of two options may be performed, as is indicated at schematic flow lines 316 and 318. First, as is indicated at functional step 320, the particular minimum/ maximum frequencies for the range of sample rates that would be used for this particular filter could be narrowed, thereby reducing the maximum change in sampling rate that could potentially occur and reducing the maximum pitch error that could result. Once narrowed, functional steps 312 and 314 are again performed to determine whether the new range would result in an acceptable maximum pitch error. If not, functional step 320 could again be performed This process could be continued until a satisfactory frequency range for this particular filter is identified.

Alternatively, functional step 322 could be performed, where a new set of discrete conversion rates could be identified that would result in a filter which provides a smaller passband and a larger stopband. Once the new conversion rates are identified, the method steps for defining a filter would again be performed, as is indicated at decisional flow line 324.

Once a filter having an acceptable pitch error is identified at method step 314, the functional method step 326 is performed, which corresponds to generation of the coefficients for the FIR low pass filter having the identified normalized cutoff frequency $f_{C-NORM}$. It will be appreciated that while most readily available, computer-based filter design algorithms could be used to generate such a filter, a design algorithm resulting in an optimized filter is preferred. For filters having extremely small transition bands, the optimal filter generation algorithms, such as Parks-McClellan, typically yield superior suppression characteristics for a given number of coefficients. However, such algorithms tend to accumulate errors in the first and last coefficients, which can cause undesirable behavior when most coefficients are skipped. Preferably, and especially where the number of coefficients is close to the inverse normalized cutoff ratio (320 in the above example), it is more suitable to use traditional windowed filter design algorithms. Such an approach requires larger filters for a comparable level of suppression, but are advantageous in that errors are not accumulated at the edges. Also, in the preferred embodiment, the signal should be scaled either before or after the filter in order to achieve zero gain due to the filter.

In the preferred embodiment, the filter designed at step 326 can optionally be further optimized, for instance, for microprocessors that use sequential multiply and add instructions rather than single Multiply and Accumulate cycles (MAC's). For instance, given the following filtering equation:

$$y(2)=x(0)*c(0)+x(1)*c(1)+x(2)*c(2),$$

where y is the output signal and x and c are the input signal and the coefficient respectfully, the coefficients can be factored so as to produce:

$$y(2)=((x(2)*c(2)/c(1)+x(1))*c(1)/c(0)+x(0)*c(0)$$

Since this type of process could be repeated for any number (n) of coefficients, the equation could be implemented in a series of executable instructions used to alter a working value or sum. These executable instructions may be patterned, for instance, on the following pseudo-code sequence:

1. Load sample (e.g., x(n));
2. Multiply by the constant (e.g., c(n)/c(n−1));
3. Add sample (e.g., x(n−1));
4. Multiply by the constant (e.g., c(n−1)/c(n−2));
5. Add sample (e.g., x(n−2));
6. Multiply by the constant (e.g., c(n−2)/c(n−3));
7. Add sample (e.g., x(n−3));
8. Multiply by the constant (e.g., c(n−3)/c(n−4));
9. Add sample (e.g., x(n−4));
10. Repeat Multiply and Add according to the above pattern;
11. Multiply by the constant (e.g., c(2)/c(1));
12. Add sample (e.g., x(1));
13. Multiply by the constant ((e.g., c(1)/c(0));
14. Add sample (e.g., x(0)); and
15. Multiply by the constant (e.g., c(0)).

This type of sequence—add and multiply—is more efficient on most general-purpose computers than the more common load, multiply, add sequence used for this type of filter operation. Since each of the constants (c(2)/c(1), c(1)/c(0), etc) simply divides the next coefficient by the current one, the filter must be designed such that there are no coefficients with a value of zero.

Having once generated and optimized an appropriate filter, the processing unit 21 is able to proceed with the program sequence in the main program illustrated in FIG. 3, and processing continues at functional program step 208.

At step 208, a series of executable instructions are performed that correspond to the function of selecting an appropriate filter (110 in FIG. 2) from the plurality of filters previously defined and stored, for instance, in nonvolatile computer memory. The filter selected will be that which has been predefined and identified as being appropriate for the particular sample rate conversion quality that is desired.

Once an appropriate filter has been selected, the series of executable instructions corresponding with the function illustrated at block 210 are performed. At that step, the interpolation (L) and decimation (M) factors are "tuned" for the particular single-stage low pass filter previously selected. By way of example, for the filter defined above in connection with the discrete conversions of TABLES 1 and 2, an 8 kHz ($f_{INPUT}$) to a 44.1 kHz ($f_{OUTPUT}$) conversion would start by placing the non-normalized cutoff frequency ($f_{CUTOFF}$) at 4 kHz. This frequency is then scaled/mapped to the normalized cutoff frequency ($f_{C-NORM}$) for the predefined filter, resulting in the interpolated, or intermediate sampling rate ($f_{INTERMEDIATE}$):

$$f_{INTERMEDIATE} = f_{CUTOFF}/f_{C-NORM} = 4 \text{ kHz}/0.003125 = 1,280 \text{ kHz}.$$

This intermediate sampling rate provides the basis for calculating the required interpolation and decimation values for the filter:

$$L = f_{INTERMEDIATE}/f_{INPUT} = 1,280 \text{ kHz}/8 \text{ kHz} = 160; \text{ and}$$

$$M = f_{INTERMEDIATE}/f_{OUTPUT} = 1,280 \text{ kHz}/44.1 \text{ kHz} = 29 \text{ (rounded down)}.$$

Once the interpolation (L) and decimation (M) factors have been calculated for the particular filter, the series of functions needed to achieve the desired conversion are performed, which are shown in the dotted box at 212. At functional step 214 the sample rate of the input signal $f_{INPUT}$ is increased by a factor of L, by inserting L-1 zero-valued samples between each existing input data sample. Thus, for the above example the input sample rate ($f_{INPUT}$) of 8 kHz will be increased by a factor of 160 to an intermediate signal having a new intermediate sample rate ($f_{INTERMEDIATE}$) of 1,280 kHz. This intermediate signal is then filtered at functional step 216 with the redefined single-stage low-pass FIR filter so as to remove high-frequency noise introduced in the interpolation stage. At functional step 218 the filtered signal is decimated by a factor of M, by removing M-1 out of every M samples. In the illustrated example, the intermediate signal, having a sample rate of 1,280 kHz is decimated by a factor of 29. The resulting output signal has the desired sample rate frequency $f_{OUTPUT}$. In the example given, since the input rate and the output rate do not correspond exactly with the optimal conversion ratios used to define the filter, the effective output rate has a pitch error. Thus, the effective output sample rate frequency is actually 44.1379 kHz, i.e. a pitch error of 0.086% from the actual output rate of 44.1 kHz.

In the flow diagram of FIG. 3, the interpolate, filter and decimate functions are illustrated as comprising as three discrete steps. However, the three functions may actually be performed in a single computational step by way of a multiply and accumulate (MAC) series of operations. This greatly reduces the bandwidth and computational expense of the conversion process. To accomplish this, as the input samples from the input signal arrive they are placed within an input history buffer in computer memory. For each output sample to be generated, the previous samples in the input buffer are multiplied by the appropriate filter coefficient. Thus, if N is the total size of the filter, the above sequence yields N/L multiply and accumulate cycles. In this way, computational overhead is reduced by skipping every Lth coefficient when filtering with the FIR filter, i.e. all samples having a zero value are skipped. This eliminates a large amount of processing requirements because the MACs are greatly reduced and, regardless of the size of the intermediate rate (which can be very large), the signal can be filtered in an efficient manner. Attached hereto at Appendix A is a sample source code listing, provided for purposes of example and not limitation, of one example of the series of instructions that could be used to implement the MAC engine for accomplishing the above operation.

In addition to utilizing the above MAC processing approach, the sample rate converter may further optimizes the series of interpolation, filter and decimation functions by further optimizing the MAC algorithm. This is accomplished in those circumstances where the desired output sample rate $f_{OUTPUT}$ is greater than the input sample rate $f_{INPUT}$. In this situation, the interpolation value L will be the same value for all conversions performed for the filter. Thus, in the filter defined in connection with the rates identified in TABLE 1, L will always be equal to 160 for all conversions where $f_{OUTPUT} > f_{INPUT}$. This is due to the fact that the input rate $f_{INPUT}$ is the minimum rate, and the relationship between the minimum rate and the intermediate rate is a constant based on the normalized cutoff frequency $f_{C-NORM}$ of the predefined filter. Thus, for this particular situation, the particular MAC algorithm can be further optimized by making the filter size a multiple of L. In this case, the number of multiply and accumulate cycles reduces to a constant N/L for all upsampling scenarios (i e., where $f_{OUTPUT} > f_{INPUT}$), and the program loop used to implement the interpolate, filter, decimate function can instead be reduced into a computationally efficient series of multiply-accumulate cycles. This eliminates any computational overhead associated with the inner loop that must otherwise be performed. Attached hereto at Appendix B is a sample source code listing, provided for purposes of illustration and not limitation, of one example of the series of instructions that could be used to implement this optimized MAC engine.

Once the series of operations shown in dotted box 212 are complete, the sample rate converter 100 can store the resulting output signal (y(m) in FIG. 2), which now has the desired sample rate $f_{OUTPUT}$, into any desirable computer memory location. The new signal can then be manipulated in any manner, depending on the particular application involved.

In summary, the present invention may be included in an efficient sample rate converter capable of converting an existing digital signal sampled at a particular rate into a digital signal having a new, desired sampling rate. The converter utilizes a method, preferably embodied as a series of computer executable instructions, that can be implemented and executed within a general purpose computer. Moreover, a unique digital filter that uses sequential multiply and add instructions is used to improve the filtering efficiency of most general-purpose microprocessors that use sequential multiply and add instructions. Upon execution, the converter utilizes the single predefined filter, which is capable of operating on a continuous range of input and output ratios. The filter is defined in a manner such that for certain critical sample rate conversions, there is no pitch variation introduced on the output signal. Moreover, the filter is sufficiently large such that it produces only minor variations in output pitch for non-critical ratios. Implementation of the converter is highly optimized, such that conversions can be done quickly, efficiently and accurately on a general purpose computer, without a need for specialized signal processing hardware.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing inscription. All changes which come within the meaning and range of equivalency of the claims are to be embraced within their scope.

APPENDIX A

```
/* Produce nOutputSamples samples generated from the input block */
/* (loop executes once for each output sample) */
pIn = pInputBuffer;
j = 0;
for (i = 0; i < nOutputSamples; i++) {
    j += M;
    /* We multiply N / L of the taps (skipping the zero samples) */
    pTemp = pIn;
    sum = 0;
    for (c = j; c < NumberOfCoefficients; c += L) {
        sum += (*pTemp);
        sum *= CoefficientTable[c];
        pTemp--;
    }
    /* We have completed this output sample */
    pOutputBuffer[i] = sum;
    while (j+M >= L) {
        /* Take the next input sample */
        pIn++;
        j -= L;
    }
}
```

APPENDIX B

```
/* Produce nOutputSamples samples generated from the input block */
/* (loop executes once for each output sample) */
pIn = pInputBuffer;
j = 0
for (i = 0; i < nOutput Samples; i++) {
    j += M;
    /* We multiply N / L of the taps (skipping the zero samples) */
    /* For this example, our filter size is 480 coefficients and L = 160 */
    sum = 0;
    sum += *pIn;
    sum *= CoefficientTable[j];
    sum += *(pIn - 160);
    sum *= CoefficientTable[j+160];
    sum += *(pIn - 320);
    sum *= CoefficientTable[j+320];
    /* We have completed this output sample */
    pOutputBuffer [i] = sum;
    while (j+M >= L) {
        /* Take the next input sample */
        pIn++;
        j -= L;
    }
}
```

What is claimed and desired to be secured by United States Letters Patent is:

1. In a digital filter for filtering an input signal "x" to produce an output signal "y", wherein filtering occurs by taking n+1 samples of the input signal "x" to extract a number of input signal samples x(0) through x(n), wherein filtering also occurs using digital filter coefficients c(0) through c(n) corresponding to the input signal samples x(0) through x(n), respectively, a method for digitally filtering using sequential multiply and add instructions for increased filtering efficiency for microprocessors that use sequential multiply and add instructions, the method comprising:

a step for loading a working value equal to a last input signal sample x(n);

where "m" is an integer initially equaling "n", a step for multiplying the working value by a constant c(m)/c(m−1) to thereby alter the working value, wherein the constant c(m)/c(m−1) is equal to the quotient of a digital filter coefficient c(m) corresponding to an input signal sample x(m) divided by a digital filter coefficient c(m−1) corresponding to a previous input signal sample x(m−1);

a step for adding the working value that resulted from the step for multiplying to the value of the previous input signal sample x(m−1) to thereby alter the working value; and a step for generating the output signal "y" based at least in part on the working value that resulted from the step for adding.

2. The method according to claim 1, wherein the step for generating the output signal "y" based at least in part on the working value that resulted from the step for adding comprises the following:

after decrementing the value of "m" by one, a step for repeating the step for multiplying and the step for adding using the decremented value of "m" to alter the working value;

a step for repeatedly implementing the step for repeating the step for multiplying and the step for adding for all values of "m" from "n" down to 1 to alter the working value;

a step for performing a final multiply of the working value that resulted from the step for repeatedly implementing to a constant c(0) corresponding to a first input signal sample x(0) to alter the working value; and a step for generating the output signal "y" to represent the working value that resulted from the step for performing a final multiply.

3. The method according to claim 1, further comprising the following:

a step for generating the digital filter coefficients c(0) through c(n) using a windowed filter design algorithm.

4. The method according to claim 1, wherein the method implements a single-stage low pass digital filter.

5. The method according to claim 4, wherein the method is implemented using a digital finite impulse response low pass filter configured so as to be capable of substantially eliminating undesired signal components appearing in a frequency band occurring above a normalized cutoff frequency.

6. The method according to claim 1, wherein the step for multiplying and the step for adding are implemented in a microprocessor that uses sequential multiply and add instructions.

7. The method according to claim 1, further comprising the following:

a specific act of scaling the input signal "x" before the digital filter, whereby zero gain is due to the digital filter.

8. The method according to claim 1, further comprising the following:

a specific act of scaling the output signal "y" after the digital filter, whereby zero gain is due to the digital filter.

9. In a digital filter for filtering an input signal "x" to produce an output signal "y", wherein filtering occurs by taking n+1 samples of the input signal "x" to extract a number of input signal samples x(0) through x(n), wherein filtering also occurs using digital filter coefficients c(0) through c(n) corresponding to the input signal samples x(0) through x(n), respectively, a computer program product for implementing a method for digitally filtering using sequential multiply and add instructions for increased filtering efficiency for microprocessors that use sequential multiply and add instructions, the computer program product comprising:

a computer-readable medium having computer-executable instructions which, when executed by a microprocessor, implement the following:
  a step for loading a working value equal to a last input signal sample x(n);
  where "m" is an integer initially equaling "n", a step for multiplying the working value by a constant c(m)/c(m−1) to thereby alter the working value, wherein the constant c(m)/c(m−1) is equal to the quotient of a digital filter coefficient c(m) corresponding to an input signal sample x(m) divided by a digital filter coefficient c(m−1) corresponding to a previous input signal sample x(m−1);
  a step for adding the working value that resulted from the step for multiplying to the value of the previous input signal sample x(m−1) to thereby alter the working value; and
  a step for generating the output signal "y" based at least in part on the working value that resulted from the step for adding.

10. The computer program product according to claim 9, wherein the computer-executable instructions for generating the output signal "y" based at least in part on the working value further comprise computer-executable instructions for performing the following:
  after decrementing the value of "m" by one, a step for repeating the step for multiplying and the step for adding using the decremented value of "m" to alter the working value;
  a step for repeatedly implementing the step for repeating the step for multiplying and the step for adding for all values of "m" from "n" down to 1 to alter the working value;
  a step for performing a final multiply of the working value that resulted from the step for repeatedly implementing to a constant c(0) corresponding to a first input signal sample x(0) to alter the working value; and
  a step for generating an output signal "y" to represent the working value that resulted from the step for performing a final multiply.

11. In a digital filter for filtering an input signal "x" to produce an output signal "y", wherein filtering occurs by taking n+1 samples of the input signal "x" to extract a number of input signal samples x(0) through x(n), wherein filtering also occurs using digital filter coefficients c(0) through c(n) corresponding to the input signal samples x(0) through x(n), respectively, a method for digitally filtering using sequential multiply and add instructions for increased filtering efficiency for microprocessors that use sequential multiply and add instructions, the method comprising:
  a specific act of a microprocessor loading a working value equal to a last input signal sample x(n);
  where "m" is an integer initially equaling "n", a specific act of the microprocessor multiplying the working value by a constant c(m)/c(m−1) to thereby alter the working value, wherein the constant c(m)/c(m−1) is equal to the quotient of a digital filter coefficient c(m) corresponding to an input signal sample x(m) divided by a digital filter coefficient c(m−1) corresponding to a previous input signal sample x(m−1);
  a specific act of the microprocessor adding the working value that resulted from the specific act of the microprocessor multiplying to the value of the previous input signal sample x(m−1) to thereby alter the working value; and
  a specific act of generating the output signal "y" based at least in part on the working value that resulted from the specific act of the microprocessor adding.

12. The method according to claim 11, wherein the specific act of generating the output signal "y" based at least in part on the working value that resulted from the specific act of the microprocessor adding comprises the following:
  after decrementing the value of "m" by one, a specific act of the microprocessor repeating the specific acts of the microprocessor multiplying and adding using the decremented value of "m" to alter the working value;
  a specific act of the microprocessor repeatedly implementing the specific act of the microprocessor repeating the specific acts of the microprocessor multiplying and adding for all values of "m" from "n" down to 1 to alter the working value;
  a specific act of the microprocessor performing a final multiply of the working value that resulted from the specific act of the microprocessor repeatedly implementing to a constant c(0) corresponding to a first input signal sample x(0) to alter the working value; and
  a specific act of generating the output signal "y" to represent the working value that resulted from the specific act of the microprocessor performing a final multiply.

13. The method according to claim 11, further comprising the following:
  a specific act of generating the digital filter coefficients c(0) through c(n) using a windowed filter design algorithm.

14. The method according to claim 11, wherein the method implements a single-stage low pass digital filter.

15. The method according to claim 14, wherein the method is implemented using a digital finite impulse response low pass filter configured so as to be capable of substantially eliminating undesired signal components appearing in a frequency band occurring above a normalized cutoff frequency.

16. The method according to claim 11, wherein the microprocessor uses sequential multiply and add instructions.

17. The method according to claim 11, further comprising the following:
  a specific act of scaling the input signal "x" before the digital filter, whereby zero gain is due to the digital filter.

18. The method according to claim 11, further comprising the following:
  a specific act of scaling the output signal "y" after the digital filter, whereby zero gain is due to the digital filter.

19. In a digital filter for filtering an input signal "x" to produce an output signal "y", wherein filtering occurs by taking n+1 samples of the input signal "x" to extract a number of input signal samples x(0) through x(n), wherein filtering also occurs using digital filter coefficients c(0) through c(n) corresponding to the input signal samples x(0) through x(n), respectively, a computer program product for implementing a method for digitally filtering using sequential multiply and add instructions for increased filtering efficiency for microprocessors that use sequential multiply and add instructions, the computer program product comprising:
  a computer-readable medium having computer-executable instructions which, when executed by a microprocessor, implement the following:
    a specific act of a microprocessor loading a working value equal to a last input signal sample x(n);
    where "m" is an integer initially equaling "n", a specific act of the microprocessor multiplying the working value by a constant c(m)/c(m−1) to thereby alter the working value, wherein the constant c(m)/c(m−1) is equal to the quotient of a digital filter coefficient c(m) corresponding to an input signal sample x(m) divided by a digital filter coefficient c(m−1) corresponding to a previous input signal sample x(m−1);

a specific act of the microprocessor adding the working value that resulted from the specific act of the microprocessor multiplying to the value of the previous input signal sample x(m−1) to thereby alter the working value; and a specific act of generating the output signal "y" based at least in part on the working value that resulted from the specific act of the microprocessor adding.

20. The computer program product according to claim 19, wherein the computer-executable instructions for generating the output signal "y" based at least in part on the working value further comprise computer-executable instructions for performing the following:

after decrementing the value of "m" by one, a specific act of the microprocessor repeating the specific acts of the microprocessor multiplying and adding using the decremented value of "m" to alter the working value;

a specific act of the microprocessor repeatedly implementing the specific act of the microprocessor repeating the specific acts of the microprocessor multiplying and adding for all values of "m" from "n" down to 1 to alter the working value;

a specific act of the microprocessor performing a final multiply of the working value that resulted from the specific act of the microprocessor repeatedly implementing to a constant c(0) corresponding to a first input signal sample x(0) to alter the working value; and a specific act of generating the output signal "y" to represent the working value that resulted from the specific act of the microprocessor performing a final multiply.

* * * * *